(12) United States Patent
Cho (10) Patent No.: US 10,878,877 B2
(45) Date of Patent: Dec. 29, 2020

(54) MEMORY DEVICE, MEMORY SYSTEM, AND METHOD FOR REFRESHING MEMORY DEVICE

(71) Applicant: SK hynix Inc., Gyeonggi-do (KR)

(72) Inventor: Ho Sung Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/433,704

(22) Filed: Jun. 6, 2019

(65) Prior Publication Data

US 2020/0051616 A1 Feb. 13, 2020

(30) Foreign Application Priority Data

Aug. 9, 2018 (KR) .......................... 10-2018-0093166

(51) Int. Cl.
*G11C 7/00* (2006.01)
*G11C 11/406* (2006.01)
*G11C 11/408* (2006.01)
*H04N 5/335* (2011.01)

(52) U.S. Cl.
CPC .... *G11C 11/40603* (2013.01); *G11C 11/4087* (2013.01); *G11C 11/40615* (2013.01); *H04N 5/3355* (2013.01)

(58) Field of Classification Search
CPC ........ G11C 11/40603; G11C 11/40615; G11C 11/4087; H04N 5/3355
USPC ....................................................... 365/222
See application file for complete search history.

(56) References Cited

U.S. PATENT DOCUMENTS

| 7,154,799 B2* | 12/2006 | Matsuzaki | G11C 7/1045 365/222 |
| 2002/0181301 A1* | 12/2002 | Takahashi | G11C 11/406 365/200 |
| 2002/0191467 A1* | 12/2002 | Matsumoto | G11C 11/40611 365/222 |
| 2003/0012070 A1* | 1/2003 | Dosaka | G11C 11/406 365/222 |
| 2003/0063512 A1* | 4/2003 | Takahashi | G11C 11/406 365/222 |
| 2005/0169083 A1* | 8/2005 | Riho | G11C 7/20 365/222 |
| 2005/0190625 A1* | 9/2005 | Matsuzaki | G11C 11/40615 365/222 |
| 2007/0008799 A1* | 1/2007 | Dono | G11C 8/08 365/222 |

(Continued)

FOREIGN PATENT DOCUMENTS

| KR | 10-2003-0050349 | 6/2003 |
| KR | 10-2012-0131423 | 12/2012 |

*Primary Examiner* — Harry W Byrne
(74) *Attorney, Agent, or Firm* — IP & T Group LLP (57) ABSTRACT

A memory device applies different refresh rates to target data (or objective data) according to data characteristics (i.e., required reliability levels). The memory device includes a memory cell array provided with a plurality of memory cells, a row decoder configured to selectively activate word lines of the memory cell array in response to a row address signal, and a refresh controller configured to output the row address signal in response to the row address signal. The refresh controller controls a refresh ratio of a first storage region and a second storage region contained in the memory cell array in response to a changeable refresh control value.

14 Claims, 4 Drawing Sheets

(56) References Cited

U.S. PATENT DOCUMENTS

| | | | | |
|---|---|---|---|---|
| 2007/0268768 A1* | 11/2007 | Kawakubo | ........ | G11C 11/40611 365/222 |
| 2008/0151670 A1* | 6/2008 | Kawakubo | .......... | G11C 11/4087 365/222 |
| 2010/0172200 A1* | 7/2010 | Kawakubo | ........... | G11C 7/1027 365/222 |
| 2018/0197599 A1* | 7/2018 | Choi | ................. | G11C 11/40615 |

* cited by examiner

MEMORY DEVICE, MEMORY SYSTEM, AND METHOD FOR REFRESHING MEMORY DEVICE

CROSS-REFERENCE TO RELATED APPLICATION

This patent application claims priority under 35 U.S.C. § 119(a) to Korean patent application No. 10-2018-0093166 filed on 9 Aug. 2018, which is hereby incorporated in its entirety by reference.

The technology and implementations disclosed in this patent application relate to a memory device, and more particularly to a memory device capable of applying different refresh rates to target data according to required reliability levels of data, and a method for refreshing the memory device.

BACKGROUND

Semiconductor memory devices are classified into a volatile memory device and a non-volatile memory device according to whether or not stored data is lost when a power supply is stopped.

The volatile memory device such as a Dynamic Random Access Memory (DRAM) from among the semiconductor memory devices periodically performs a refresh operation so as to retain data stored therein.

In an auto-refresh operation mode, the Dynamic Random Access Memory (DRAM) refreshes a plurality of memory cells in response to a refresh command received from an external part. In a self-refresh operation mode, the Dynamic Random Access Memory (DRAM) autonomously refreshes memory cells according to operational information of a refresh counter.

In recent times, many developers and companies are conducting intensive research into various technologies capable of enhancing refresh performance or throughput of volatile memory devices.

SUMMARY

This patent application provides designs of a memory device, a memory system, and a method for refreshing the memory device that substantially obviate one or more problems due to the limitations and disadvantages of the related art.

An embodiment of the present disclosure relates to a memory device for relatively strengthening a refresh operation of data in which high reliability is required, using different refresh rates based on data characteristics, thereby providing higher-reliability data.

In accordance with an aspect of the present disclosure, a memory device includes a memory cell array provided with a plurality of memory cells, a row decoder configured to selectively activate word lines of the memory cell array in response to a row address signal, and a refresh controller configured to output the row address signal in response to the row address signal. The refresh controller controls a refresh ratio of a first storage region and a second storage region contained in the memory cell array in response to a changeable refresh control value.

In accordance with an aspect of the present disclosure, a memory system includes a memory device configured to store data in a first storage region and in a second storage region in response to a command signal and an address signal, and control a refresh ratio of the first storage region and the second storage region in response to a changeable refresh control value, and a memory controller configured to output the command signal, the address signal, and the refresh control value to the memory device in response to a control signal received from a host.

In accordance with an aspect of the present disclosure, a method for refreshing a memory device includes selectively outputting a first refresh address and a second refresh address in response to a refresh signal and a refresh control value. The refresh control value is changeable, and a number of output times of the second refresh address is higher than a number of output times of the first refresh address by a predetermined number of times corresponding to a multiple of the refresh control value.

It is to be understood that both the foregoing general description and the following detailed description of embodiments are exemplary and explanatory.

BRIEF DESCRIPTION OF THE DRAWINGS

The above and other features and advantages of the present disclosure will become readily apparent by reference to the following detailed description when considered in conjunction with the accompanying drawings.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1:
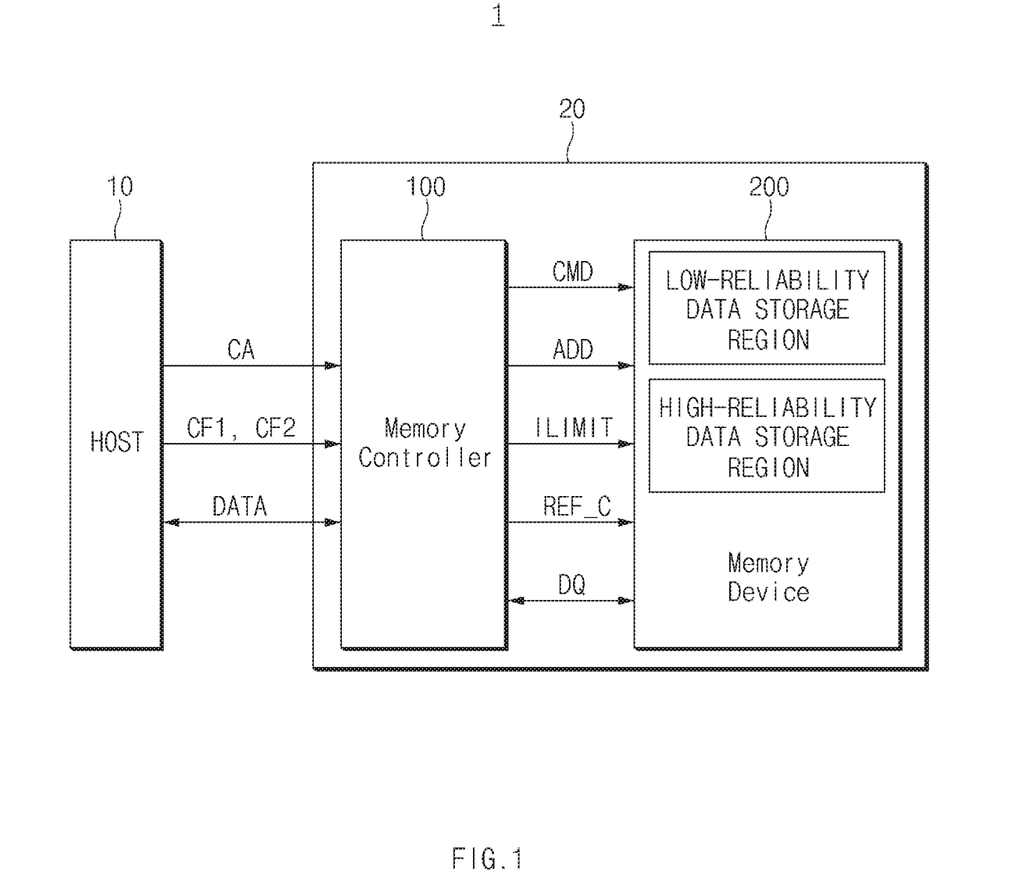
FIG. 1 is a block diagram illustrating an electronic system in accordance with an embodiment of the disclosed technology.

FIG. 1 is a block diagram illustrating an electronic system 1 in accordance with an embodiment of the disclosed technology.

Referring to FIG. 1, the electronic system 1 may include a host 10 and a memory system 20. The memory system 20 may include a memory controller 100 and a memory device 200.

As can be seen from FIG. 1, the host 10 may control a function for storing data in the memory system 20 using a command/address CA. For example, when the host 10 desires to store data DATA in the memory system 20 or desires to refresh (or auto-refresh) data stored in the memory system 20, or when the host 10 requires data stored in the memory system 20, the host 10 may generate the command/address CA and transmit the command/address CA to the memory system 20.

Specifically, the host 10 may variably adjust not only the sizes of storage regions to be used for storing data having different characteristics, but also refresh rates of the storage regions according to characteristics of objective data to be stored in the memory system 20. For example, when the host 10 attempts to simultaneously store data requiring high reliability (hereinafter referred to as high-reliability data) and other data which does not require high reliability (hereinafter referred to as low-reliability data) in the memory device 200, the host 10 may discriminate between a first region (or a first range) to be used for storing low-reliability data and a second region (or a second range) to be used for storing high-reliability data within the entire storage region, and may allow the first region (hereinafter referred to as a low-reliability data storage region) to be used for storing low-reliability data to have a different refresh rate than the second region (hereinafter referred to as a high-reliability data storage region) to be used for storing high-reliability data, such that the first region and the second region may have different refresh rates. To this end, the host 10 may transmit a first control factor CF1 configured to determine a per-data storage region and a second control factor CF2 configured to determine a refresh rate for each storage region to the memory system 200. In this case, the low-reliability data may be raw image data captured by a sensor such as an image sensor, and the high-reliability data may be acquired by processing the raw image data using a specific algorithm. For example, the high-reliability data may be image compression data, image processed metadata, etc.

The control factors CF1 and CF2 may be randomly established or changed by a system administrator. If the control factors CF1 and CF2 are changed by the system administrator, the host 10 may transmit the changed control factors CF1 and CF2 to the memory systems 20. Thereafter, when the host 10 attempts to store data in the memory system 200, the host 10 may determine whether data to be stored in the memory system 200 is high-reliability data or low-reliability data, and may generate a command/address CA to store data in a storage region corresponding to the control factor CF1.

The host 10 may be any one of a Central Processing Unit (CPU), a microprocessor, and an Application Processor (AP), etc. The host 10 may communicate with the memory system 20 using any one of various interface protocols, for example, PCI-express (PCI-E), Advanced Technology Attachment (ATA), Serial Advanced Technology Attachment (SATA), a Parallel Advanced Technology Attachment (PATA), and Serial Attached SCSI (SAS). However, the scope or spirit of such interface protocols between the host 10 and the memory system 200 is not limited thereto, and the host 10 and the memory system 200 may communicate with each other using any one of other interface protocols, for example, Universal Serial Bus (USB), Multimedia Card (MMC), Enhanced Small Disk Interface (ESDI), and Integrated Drive Electronics (IDE).

Upon receiving control signals CA, CF1 and CF2 from the host 10, the memory system 20 may store data DATA, may read the stored data, and may transmit the read data to the host 10. Specifically, the memory system 200 may divide a storage region into a plurality of sub storage regions (e.g., a low-reliability data storage region and a high-reliability data storage region) under control of the host 10, and may refresh the respective sub storage regions using different refresh rates. The memory system 20 may include the memory controller 100 and the memory device 200.

In response to the command/address CA received from the host 10, the memory controller 100 may store data DATA received from the host 10 or may transmit data DQ stored in the memory device 200 to the host 10.

Firstly, in response to the command/address CA (acting as a control signal) received from the host 10, the memory controller 100 may generate not only a command signal CMD needed to activate the memory device 200 but also an address signal ADD. The memory controller may transmit the generated command signal CMD and the generated address signal ADD to the memory device 200, may generate not only a command signal CMD needed for a write operation and a read operation of data but also an address signal ADD. The memory controller may transmit the generated command signal CMD and the generated address signal ADD to the memory device 200, may generate not only a command signal CMD needed for the refresh operation but also an address signal ADD, and may transmit the generated CMDN signal and the address signal ADD. As a result, in response to the command/address CA received from the host 10, the above-mentioned operations for generating the command signal CMD and the address signal ADD then transmitting the generated command signal CMD and the generated address signal ADD to the memory device 200 may be successively carried out.

Specifically, upon receiving the control factor values CF1 and CF2 from the host 10, the memory controller 100 may generate a refresh threshold value ILIMIT and a refresh control value REF_C corresponding to the received control factor values CF1 and CF2, and may transmit the generated refresh threshold value ILIMIT and the generated refresh control value REF_C to the memory device 200. In this case, the refresh threshold value ILIMIT may include an address value representing a boundary of a sub storage region (e.g., a low-reliability data storage region) divided by the host 10. For example, assuming that addresses of the entire region of the memory device 200 are set to addresses "0 to MAX", a storage region corresponding to some addresses "0 to ILIMIT" may be set to a low-reliability data storage region, and a storage region corresponding to other addresses "ILIMIT+1 to MAX" may be set to a high-reliability data storage region. The refresh control value REF_C may include a specific value for determining a refresh rate of each storage region determined by the host 10. In other words, the specific value may be used to determine a refresh rate of the low-reliability data storage region and a refresh rate of the high-reliability data storage region.

The memory device 200 may include a plurality of memory cells arranged in a matrix in row and column directions, may store data DQ in the memory cells upon receiving the command signal CMD and the address signal ADD from the memory controller 100, and may transmit the stored data DQ to the memory controller 100. In addition, the memory device 200 may refresh the memory cells in response to either a refresh command received from the memory controller 100 or a refresh signal generated therein.

Specifically, the memory device 200 may store the refresh threshold value ILIMIT and the refresh control value REF_C received from the memory controller 100, and may refresh the memory cells by allocating different refresh rates to the respective storage regions according to the stored refresh threshold value ILIMIT and the stored refresh control value REF_C. For example, assuming that row addresses of the entire storage space of the memory device 200 are set to addresses "0 to MAX(AX[0:n])", at least one row address designated by the refresh threshold value ILIMIT is set to at least one address "ILIMIT(AX[0:n])", and a refresh control value REF_C is set to 3, the memory device 200 may determine a refresh ratio of a storage region corresponding to addresses "0 to ILIMIT(AX[0:n])" and the other storage region corresponding to addresses "LIMIT (AX[0:n])+1 to MAX(AX[0:n])" to be a specific refresh ratio of 1:3, such that the memory device 200 may refresh the two storage regions using the refresh ratio of 1:3. In more detail, in a process for repeatedly refreshing the memory cells, the memory device 200 may refresh the storage region corresponding to the addresses "0 to ILIMIT(AX[0:n])" according to a predetermined refresh pattern in which the first storage region corresponding to the addresses "0 to ILIMIT(AX[0:n])" is first refreshed once and the second storage region corresponding to the addresses "ILIMIT(AX [0:n])+1 to MAX(AX[0:n])" is successively refreshed three times.

Although FIG. 1 exemplarily illustrates only one memory device 200 corresponding to the memory controller 100 for convenience of description and better understanding of the present disclosure, the scope or spirit of the present disclosure is not limited thereto, and the memory device 200 may also be implemented as a memory module provided with a plurality of memory devices 200 as necessary. In this case, the memory module may also be implemented as an Unbuffered Dual In-line Memory Module (UDIMM), a Registered Dual In-line Memory Module (RDIMM), or a Load Reduced Dual In-line Memory Module (LRDIMM).

Figure 2:
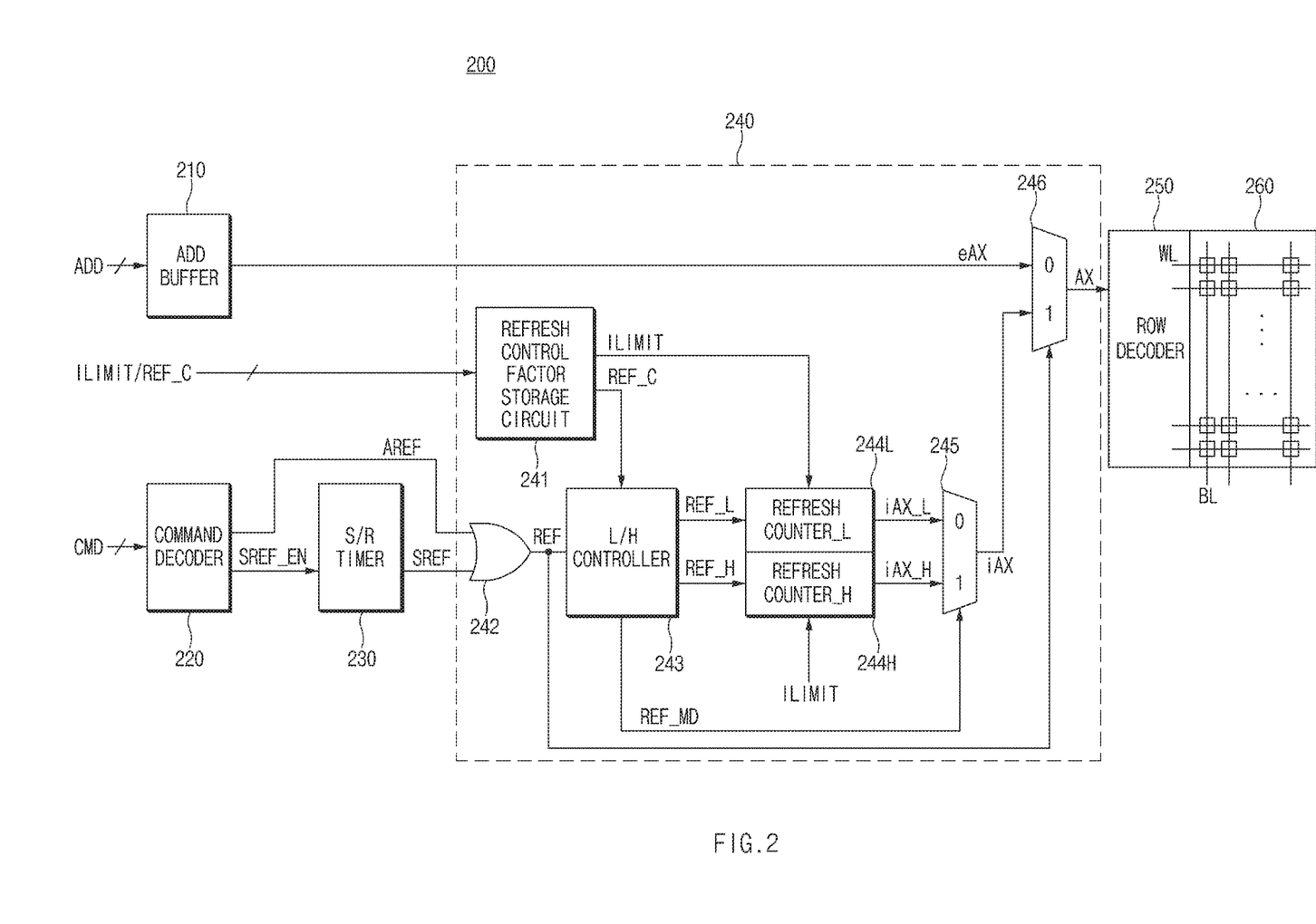
FIG. 2 is a schematic diagram illustrating a memory device for use in the electronic system shown in FIG. 1 in accordance with an embodiment of the disclosed technology.

FIG. 2 is a schematic diagram illustrating the memory device 200 for use in the electronic system 10 shown in FIG. 1.

Referring to FIG. 2, the memory device 200 may include an address (ADD) buffer 210, a command decoder 220, a self-refresh (S/R) timer 230, a refresh controller 240, a row decoder 250, and a memory cell array 260.

The ADD buffer 210 may temporarily store at least one address (ADD) (i.e., a row address and a column address) received from the memory controller 100 therein. For convenience of description and better understanding, the following embodiment will hereinafter be disclosed by referring to only the row address from among the row and column addresses. The ADD buffer 210 may transmit the received address to the refresh controller 240.

The command decoder 220 may decode the command signal CMD received from the memory controller 100. For example, the command decoder 220 may decode a row address strobe signal (/RAS), a column address storage signal (/CAS), and a write enable signal (/WE), a clock enable signal (/CKE), etc., such that the command decoder 220 may generate and output an auto-refresh signal AREF and a self-refresh enable signal SREF_EN.

Upon receiving the self-refresh enable signal SREF_EN from the command decoder 220, the self-refresh (S/R) timer 230 may activate the self-refresh signal SREF after lapse of a predetermined time from the reception time of the self-refresh enable signal SREF_EN.

In response to an address received from the ADD buffer 210, an auto-refresh signal AREF received from the command decoder 220, a self-refresh signal SREF received from the self-refresh (S/R) timer 230, and a refresh threshold value ILIMIT and a refresh control value REF_C that are received from the memory controller 100, the refresh controller 240 may transmit a row address AX to the row decoder 250. If the refresh signals AREF and SREF are not activated, the refresh controller 240 may provide the row decoder 250 with an external address (eAX) acting as a row address AX. In this case, the external address (eAX) may refer to an address received from the ADD buffer 210. On the other hand, when the auto-refresh signal AREF or the self-refresh signal SREF is activated, the refresh controller 240 may generate an internal address (iAX) for the refresh operation, and may provide the row decoder 250 with the generated internal address (iAX) acting as the row address (AX).

Specifically, the refresh controller 240 may control an address (iAX) for such refresh (hereinafter referred to as a refresh address iAX) to be output at different refresh rates to the respective storage regions of the memory cell array 260 according to the refresh threshold value ILIMIT and the refresh control value REF_C. That is, different rates of refresh addresses (iAX) may be output to the respective storage regions of the memory cell array 260 according to the refresh threshold value ILIMIT and the refresh control value REF_C.

The refresh controller 240 may include a refresh control factor storage circuit 241, a logic OR element 242, a low/high (L/H) controller 243, refresh counters 244L and 244H, a first multiplexer 245, and a second multiplexer 246.

The refresh control factor storage circuit 241 may receive the refresh threshold value ILIMIT and the refresh control value REF_C from the memory controller 100, and may store the received refresh threshold value ILIMIT and the received refresh control value REF_C therein. The refresh control factor storage circuit 241 may include a register.

The logic OR element 242 may perform a logic OR operation between the auto-refresh signal AREF and the self-refresh signal SREF, and may output the logic OR operation result to the L/H controller 243. If any one of the auto-refresh signal AREF and the self-refresh signal SREF is activated, the logic OR element 242 may activate the refresh signal REF, and may output the activated refresh signal REF to the L/H controller 243.

If the refresh signal REF is activated, the L/H controller 243 may control (or adjust) the output ratio of a first refresh control signal REF_L and a second refresh control signal REF_H according to a refresh control value REF_C. For example, if the refresh control value REF_C is set to "3", the L/H controller 243 may successively generate the first refresh control signal REF_L and the second refresh control signal REF_H using the output ratio of 1:3, and may respectively output the generated first refresh control signal REF_L and the generated second refresh control signal REF_H that have the output ratio of 1:3 therebetween to the refresh counters 244L and 244H. That is, after the L/H controller 243 outputs the first refresh control signal REF_L to the refresh counter 244L only once, the L/H controller 243 may successively output the second refresh control signal REF_H to the refresh counter 244H three times, may output the first refresh control signal REF_L to the refresh counter 244L once again, and may then successively output the second refresh control signal REF_H to the refresh counter 244H three times. During execution of the refresh operation, the L/H controller 243 may repeatedly generate the first refresh control signal REF_L and the second refresh control signal REF_H that have the above-mentioned ratio therebetween, and may then output the generated first refresh control signal REF_L and the generated second refresh control signal REF_H to the refresh counters 244L and 244H, respectively. Alternatively, the L/H controller 243 may successively output the first refresh control signal REF_L in a manner that the entire low-reliability data storage region is refreshed only once, and may then successively output the second refresh control signal REF_H in a manner that the entire high-reliability data storage region is successively refreshed three times.

In the process of outputting the first refresh control signal REF_L and the second refresh control signal REF_H, the L/H controller 243 may output a refresh mode signal REF_MD indicating which one of the first refresh control signal REF_L and the second refresh control signal REF_H is output as a current refresh signal. For example, when the first refresh control signal REF_L is output, the L/H controller 243 may deactivate the refresh mode signal REF_MD (i.e., the refresh mode signal REF_MD is set to "0"). When the second refresh control signal REF_H is output, the L/H controller 243 may activate the refresh mode signal REF_MD (i.e., the refresh mode signal REF_MD is set to "1").

FIG. 2 is a conceptual diagram illustrating an exemplary case in which the L/H controller 243 receives an output signal of the logic OR element 242 as an input. However, the L/H controller 243 may directly receive the auto-refresh signal AREF and the self-refresh signal SREF. If at least one of the auto-refresh signal AREF and the self-refresh signal SREF is activated, the L/H controller 243 may output the first refresh control signal REF_L and the second refresh control signal REF_H according to the refresh control value REF_C.

The refresh counter 244L may output a first refresh address iAX_L) according to the first refresh control signal REF_L received from the L/H controller 243 and the refresh threshold value ILIMIT stored in the refresh control factor storage circuit 241. For example, the refresh counter 244L may output the first refresh address (iAX_L) corresponding to the first refresh control signal REF_L in a manner that an address value can sequentially increase within the range from a predetermined start row address (e.g., an initial row address of the memory cell array 260) to the other row address corresponding to the refresh threshold value ILIMIT. In this case, the storage region ranging from the start row address of the memory cell array 260 to the other row address corresponding to the refresh threshold value ILIMIT may be used as a low-reliability data storage region. When the first refresh address (iAX_L) reaches the refresh threshold value ILIMIT, the refresh counter 244L may sequentially re-output the first refresh address (iAX_L) originating from the start row address.

The refresh counter 244H may output a second refresh address (iAX_H) according to the second refresh control signal REF_H received from the L/H controller 243 and the refresh threshold value ILIMIT stored in the refresh control factor storage circuit 241. For example, the refresh counter 244H may output the second refresh address (iAX_H) corresponding to the second refresh control signal REF_H in a manner that an address value can sequentially increase within the range from a subsequent address (ILIMIT+1) of the refresh threshold value ILIMIT to a predetermined final row address (e.g., a final row address of the memory cell array 260). In this case, the storage region, that ranges from the subsequent address (ILIMIT+1) of the row address corresponding to the refresh threshold value ILIMIT to the final row address, from among the memory cell array 260 may be used as a high-reliability data storage region. When the second refresh address (iAX_H) reaches the final row address, the refresh counter 244H may sequentially output the second refresh address (iAX_H) starting from the subsequent address (ILIMIT+1) of the row address corresponding to the refresh threshold value ILIMIT.

Upon receiving the refresh mode signal REF_MD from the L/H controller 243, the first multiplexer 245 may output any one of the first refresh address (iAX_L) and the second refresh address (iAX_H) as the refresh address (iAX) acting as an internal address. For example, when the refresh mode signal REF_MD is deactivated (i.e., the refresh mode signal REF_MD is set to "0"), the first multiplexer 245 may output the first refresh address (iAX_L) as the refresh address (iAX). In contrast, when the refresh mode signal REF_MD is activated (i.e., the refresh mode signal REF_MD is set to "1"), the first multiplexer 245 may output the second refresh address (iAX_H) as the refresh address (iAX).

In response to an output signal of the logic OR element 242, the second multiplexer 246 may select any one of an external address (eAX) received from the address (ADD) buffer 210 and the refresh address (iAX) received from the first multiplexer 245 as the row address (AX), and may output the selected address (eAX or iAX) to the row decoder 250. That is, during a normal mode for Input/Output (I/O) operations of data DQ, the second multiplexer 246 may output the external address (eAX) received from the address buffer 210 to the row decoder 250. During a refresh mode, the second multiplexer 246 may output the refresh address (iAX) received from the first multiplexer 245 to the row decoder 250.

The row decoder 250 may decode the row address AX received from the second multiplexer 246, and may thus activate a word line WL corresponding to the row address AX.

The memory cell array 260 may include a plurality of memory cells coupled to word lines WL and bit lines BL such that the memory cells are arranged in a matrix in row and column directions. Data DQ received from the memory controller 100 may be stored in the memory cells.

Figure 3:
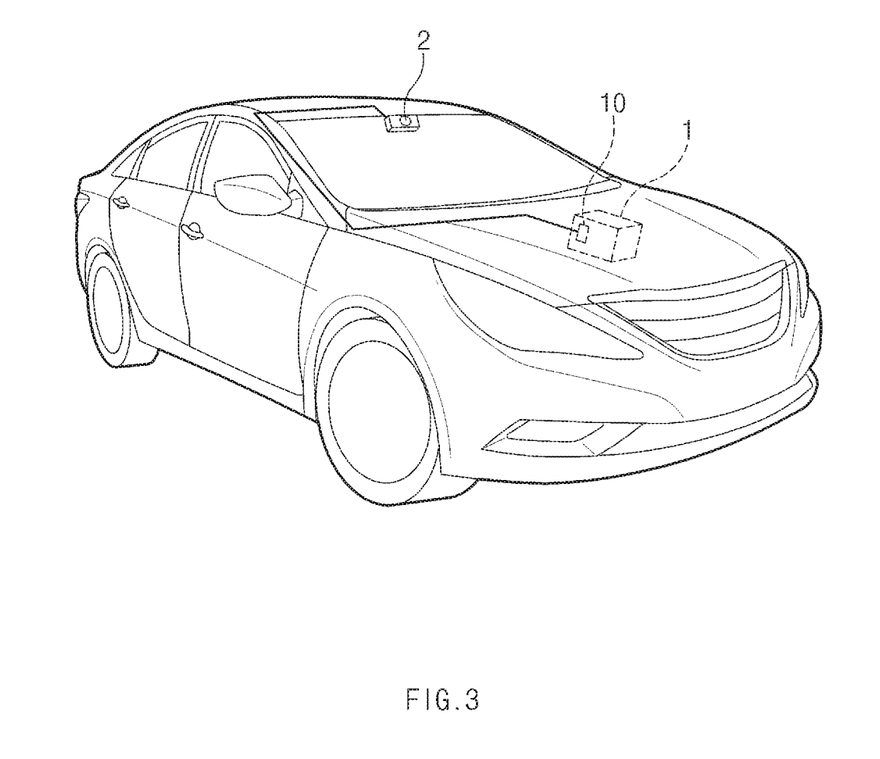
FIG. 3 is a view illustrating the electronic system shown in FIG. 1 applied to a vehicle in accordance with an embodiment of the disclosed technology.

FIG. 3 is a view illustrating an electronic system 1 shown in FIG. 1 which is applied to a vehicle in accordance with an embodiment of the disclosed technology.

Referring to FIG. 1, the electronic system 1 may be located in the vehicle (e.g., in a console box of the vehicle), and may be coupled to an image sensing device 2.

An initial value of the refresh threshold value ILIMIT and an initial value of the refresh control value REF_C may be predefined in the electronic system 1. The refresh threshold value ILIMIT and the refresh control value REF_C may be controlled or adjusted by a user, e.g., a vehicle driver or a system mechanic, who uses an external interface device, i.e., an external input device.

The image sensing device 2 may capture images of peripheral situations of the vehicle, may generate raw image data based on the captured images, and may output the generated raw image data to the electronic system 1. The image sensing device 2 may include a Complementary Metal Oxide Semiconductor (CMOS) image sensor. Although FIG. 3 exemplarily illustrates only one image sensing device for convenience of description and better understanding of the present disclosure, the scope or spirit of the present disclosure is not limited thereto, and a plurality of image sensing devices may be installed at proper locations of the vehicle (for example, at front, rear, left and right locations of the vehicle).

Figure 4:
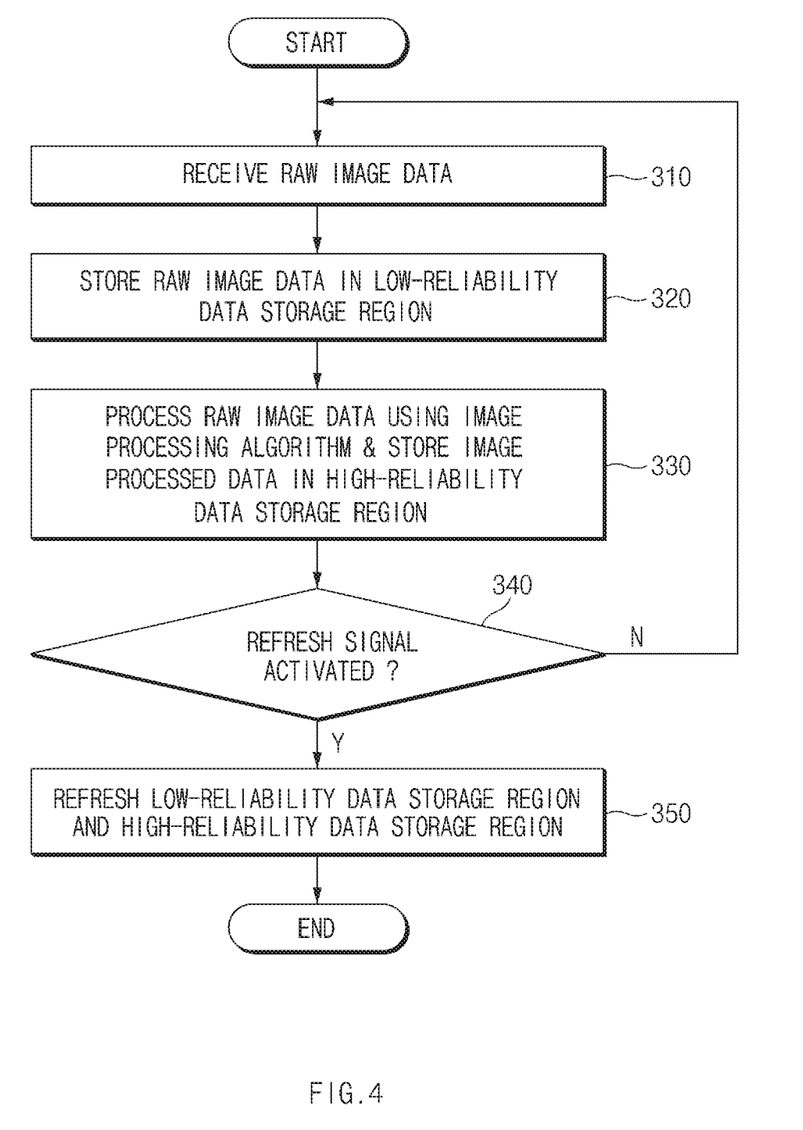
FIG. 4 is a flowchart illustrating a method for performing a data storage and refresh operation of the electronic system in accordance with an embodiment of the disclosed technology.

FIG. 4 is a flowchart illustrating a method for performing a data storage and refresh operation of the electronic system 1 in accordance with an embodiment of the disclosed technology. FIG. 4 exemplarily illustrates an exemplary case in which the electronic system 1 is embedded in the vehicle as shown in FIG. 3.

Referring to FIGS. 3 and 4, the host 10 of the electronic system 1 may receive, in real time, raw image data captured by the image sensing device 2 from the image sensing device 2 (Step 310).

The host 10 of the electronic system 1 may sequentially store the raw image data received from the image sensing device 2 in the memory device 200 of the memory system 20. In this case, the host 10 may control the raw image data to be stored in a predetermined low-reliability data storage region of the memory device 200 (Step 320).

In other words, the host 10 may determine the raw image data received from the image sensing device 2 to be low-reliability data. The host 10 may generate a command/address (CA) in a manner that the low-reliability data should be stored in the predetermined low-reliability data storage region of the memory device 200 and transmit the low-reliability data and the command/address (CA) to the memory system 20.

In this case, assuming that row addresses of the entire storage region of the memory device 200 are set to addresses "0 to MAX(AX[0:n])", row addresses designated by the refresh threshold value ILIMIT are set to ILIMIT(AX[0:n]), and a refresh control value REF_C is set to "3", a storage region corresponding to low addresses 0 to ILIMIT(AX[0:n]) may be set to a low-reliability data storage region.

The host 10 stores the raw image data in the memory system 20 and reads the stored raw image data from the memory system 20, such that the host 10 may process the read raw image data using a predetermined algorithm (or a specific program or application), and may store the processed data in the memory system 20. In this case, the host 10 may control the processed data to be stored in the high-reliability data storage region predefined in the memory device 20 (Step 330).

In other words, the host 10 may determine data acquired when the raw image data is processed by the predetermined algorithm, to be high-reliability data. The host 10 may generate a command/address (CA) in a manner that the high-reliability data should be stored in the predetermined high-reliability data storage region of the memory device 200 and transmit the high-reliability data and the command/address (CA) to the memory system 20.

For example, the host 10 may detect an object from the raw image data using an image processing algorithm, and may perform tracking of the detected object using the image processing algorithm. The host 10 may perform various operations about the object. For example, the host 10 may calculate a distance to the object, and may also calculate a relative speed about the object. The host 10 may store data acquired from the above image processing in the high-reliability data storage region of the memory device 200.

In this case, the high-reliability data storage region may be a storage region that corresponds to some addresses "ILIMIT(AX[0:n])+1 to MAX(AX[0:n])" from among row addresses of the entire storage region of the memory device 200.

When the auto-refresh signal AREF or the self-refresh signal SREF is activated (Step 340) in repeated execution of the operation of writing or reading the raw image data and the image processed data in or from the memory device 200 as shown in steps 320 and 330, the refresh controller 240 of the memory device 200 may refresh the low-reliability data storage region and the high-reliability data storage region in response to the refresh threshold value ILIMIT and the refresh control value REF_C that are stored in the refresh control factor storage circuit 241 (Step 350).

In this case, the refresh controller 240 may discriminate between the low-reliability data storage region and the high-reliability data storage region on the basis of the refresh threshold value ILIMIT, and may allow the number of refresh for the low-reliability data storage region to be different from the number of refresh for the high-reliability data storage region according to the refresh control value REF_C.

For example, when the refresh control value REF_C is set to "3" and then stored, the refresh controller 240 may control the low-reliability data storage region corresponding to addresses "0 to ILIMIT(AX[0:n])" and the high-reliability data storage region corresponding to addresses "ILIMIT(AX[0:n])+1 to MAX(AX[0:n])" from among the row addresses "0 to MAX(AX[0:n])" of the entire storage region of the memory cell array 260 to be refreshed in different ways based on the refresh rate of 1:3. That is, in the process of controlling the refresh operation of the memory cell array 260, the refresh controller 240 may allow the high-reliability data storage region to be refreshed three times whenever the low-reliability data storage region is refreshed once.

If the refresh signal is not activated in step 340, the above-mentioned operations disclosed in steps 310, 320, and 330 may be repeatedly carried out.

As described above, the embodiments of the present disclosure may refresh the memory device a predetermined number of times based on specifications. In this case, data in which high-reliability is not required may be refreshed a relatively small number of times, and other data in which high-reliability is required may be refreshed a relatively larger number of times, resulting in increased reliability of significant or important data.

As is apparent from the above description, the memory device and the method for refreshing the same in accordance with the embodiments of the present disclosure may provide data stored in the memory device with higher reliability.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly referenced by each other in the appended claims may be presented in combination as another embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A memory device comprising:
   a memory cell array provided with a plurality of memory cells;
   a row decoder configured to selectively activate word lines of the memory cell array in response to a row address signal; and
   a refresh controller configured to output the row address signal in response to the row address signal,
   wherein the refresh controller controls a refresh ratio of a first storage region and a second storage region contained in the memory cell array based on a changeable refresh control value.

2. The memory device according to claim 1, wherein the refresh controller is configured to receive the refresh control value from a memory controller.

3. The memory device according to claim 1, wherein the refresh controller is configured to allow the number of refresh times of the second storage region to be higher than the number of refresh times of the first storage region by a predetermined number of times corresponding to a multiple of the refresh control value.

4. The memory device according to claim 1, wherein the refresh controller is configured to determine a range of the first storage region and a range of the second storage region in response to a changeable refresh threshold value.

5. The memory device according to claim 4, wherein the first storage region is a storage region that ranges from a predetermined start row address to a row address corresponding to the refresh threshold value within the memory cell array.

6. The memory device according to claim 5, wherein the second storage region is a storage region that ranges from a subsequent address of the row address corresponding to the refresh threshold value to a predetermined final row address within the memory cell array.

7. The memory device according to claim 4, wherein the refresh controller includes:
a low/high (L/H) controller configured to output a first refresh control signal, a second refresh control signal, and a refresh mode signal in response to the refresh signal and the refresh control value;
a first refresh counter configured to output a first refresh address in response to the refresh threshold value and the first refresh control signal;
a second refresh counter configured to output a second refresh address in response to the refresh threshold value and the second refresh control signal; and
a multiplexer configured to output any one of the first refresh address and the second refresh address in response to the refresh mode signal.

8. The memory device according to claim 7, wherein the L/H controller is configured to output the second refresh control signal more than the first refresh control signal by a predetermined number of times corresponding to a multiple of the refresh control value.

9. The memory device according to claim 8, wherein the first refresh counter is configured to output the first refresh address within a predetermined range from a predetermined start row address to a row address corresponding to the refresh threshold value in response to the first refresh control signal.

10. The memory device according to claim 9, wherein the second refresh counter is configured to output the second refresh address within a predetermined range from a subsequent address of the row address corresponding to the refresh threshold value to a predetermined final row address.

11. The memory device according to claim 8, wherein the L/H controller is configured to repeatedly perform a process in which the first refresh control signal is first generated once and the second refresh control signal is then successively generated a predetermined number of times corresponding to the refresh control value.

12. The memory device according to claim 8, wherein the L/H controller is configured to repeatedly perform a process in which the first refresh control signal is successively generated in a manner that a whole of the first storage region is refreshed once and the second refresh control signal is then successively generated in a manner that a whole of the second storage region is repeatedly refreshed a predetermined number of times corresponding to the refresh control value.

13. The memory device according to claim 7, wherein the L/H controller deactivates the refresh mode signal during output of the first refresh control signal, and activates the refresh mode signal during output of the second refresh control signal.

14. The memory device according to claim 1, further comprising:
a command decoder configured to output an auto-refresh signal and a self-refresh enable signal by decoding a command signal received from an external part; and
a self-refresh timer configured to output a self-refresh signal in response to the self-refresh enable signal.

* * * * *